United States Patent
Zhang et al.

(10) Patent No.: US 8,265,303 B2
(45) Date of Patent: Sep. 11, 2012

(54) CIRCUITS AND METHODS FOR REDUCING POP NOISE IN CLASS D AMPLIFIERS

(75) Inventors: Hongbo Zhang, Shanghai (CN); Vincent Fong, Cupertino, CA (US); Jing Xu, Shanghai (CN); Yuling Khang, Shanghai (CN)

(73) Assignee: PacificTech Microelectronics, Inc. (KY)

( * ) Notice: Subject to any disclaimer, the term of this patent is extended or adjusted under 35 U.S.C. 154(b) by 744 days.

(21) Appl. No.: 12/401,905

(22) Filed: Mar. 11, 2009

(65) Prior Publication Data
US 2010/0232628 A1    Sep. 16, 2010

(51) Int. Cl.
H04B 1/00    (2006.01)
(52) U.S. Cl. .......................... 381/119; 330/10
(58) Field of Classification Search ............... 381/119; 330/10
See application file for complete search history.

(56) References Cited

U.S. PATENT DOCUMENTS

| 5,815,581 A * | 9/1998 | Andersson ................ 381/321 |
| 7,262,658 B2 * | 8/2007 | Ramaswamy et al. ........ 330/251 |
| 7,279,965 B2 * | 10/2007 | Hansen et al. ................ 330/10 |
| 2006/0262843 A1 * | 11/2006 | Kim et al. .................... 375/238 |

* cited by examiner

Primary Examiner — Douglas Menz
(74) Attorney, Agent, or Firm — Fountainhead Law Group PC

(57) ABSTRACT

In one embodiment the present invention includes a method for starting up a class D amplifier. The method comprises increasing, gating, and driving. The increasing includes increasing a duty cycle of a pulse train from a first duty cycle to a second duty cycle. The gating includes gating a signal based on the increasing of the duty cycle. The gating results in a gated signal. The driving includes driving an output signal from the gated signal to charge an output capacitor. The output capacitor is coupled to a speaker. The increasing of the duty cycle contributes to the charging of the output capacitor such that switching sounds detectable by the human ear are reduced.

21 Claims, 7 Drawing Sheets

CIRCUITS AND METHODS FOR REDUCING POP NOISE IN CLASS D AMPLIFIERS

CROSS REFERENCE TO RELATED APPLICATIONS

Not Applicable

BACKGROUND

The present invention relates to class D amplifiers, and in particular, to circuits and methods for reducing pop noise in class D amplifiers.

Unless otherwise indicated herein, the approaches described in this section are not prior art to the claims in this application and are not admitted to be prior art by inclusion in this section.

A switching amplifier, sometimes referred to as a class D amplifier, is an amplifier where the output transistors are operated as switches. One example of a transistor used in switching amplifiers is a MOSFET. When the transistor is off, the circuit behaves like an open circuit so the current is zero. When the transistor is on, the voltage across the transistor is ideally zero. In practice, the voltage is very small. Since the equation for power is P=V*I, the power dissipated by the amplifier is very low in both states. This increases the efficiency, thus requiring less power from the power supply and allowing smaller heat sinks for the amplifier, for example. The increased efficiency translates into benefits such as longer battery life. The decrease in the size of the heat sinks lowers the weight, cost, and size of the amplifier. Example applications where these advantages would be useful are portable battery-powered equipment such as cellular technology or portable music players.

Figure 1:
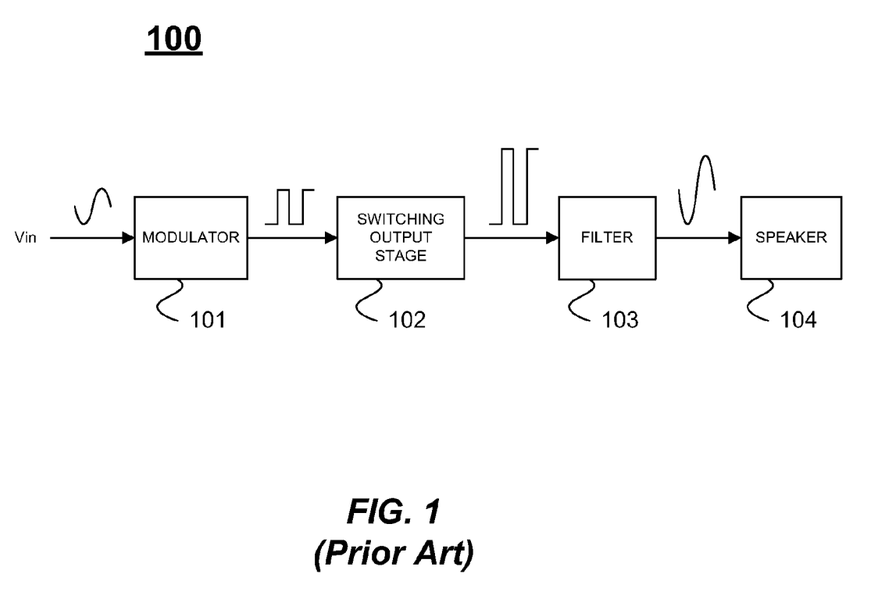
FIG. 1 illustrates a prior art class D amplifier system.

FIG. 1 illustrates a signal received by a switching amplifier. A continuous input signal is received by a modulator 101 and converted into a train of pulses. The input signal is transformed into a stream of pulses where the pulse characteristics are linked to the amplitude of the input signal. For example, within each period, the duty cycle of a pulse may be proportional to the amplitude of the input signal. For instance, if the input signal received is constant at zero, the duty cycle of the output pulses may be 50%. If the input signal received is highly positive, the duty cycle of the output pulses may be near 100%. Conversely, if the input signal received is highly negative, the duty cycle may be near 0%.

The modulated signal is then amplified in a switching output stage 102. Since the modulated signal is represented by a train of pulses, the output transistors operate like switches. This enables the transistors to have zero current when they are not switching and a low voltage drop across the transistors when they are switching.

The amplified signal generated by output stage 102 then enters a filter 103 before entering a speaker 104. The filter translates the modified amplified signal back into a continuous signal. A typical filter is an LC filter, for example. The resulting amplified continuous signal may be provided to a speaker and translated into sound. The benefits of filters include minimizing electromagnetic interference ("EMI") and power dissipation in the amplified signal.

However, one disadvantage of switching amplifiers in audio applications is the clicking and popping sounds that may occur during power up, power down, or other abrupt changes in the operating conditions of the class D amplifier. For example, filter 103 may include a capacitor which forms a high pass filter with an impedance of speaker 104. The low pass portion of filter 103 may allow this output signal to be coupled to speaker 104 through this capacitor and sound like clicking, popping, or other switching sounds from speaker 104.

Some systems have utilized muting and enable circuits to reduce switching sounds caused by class D audio amplifiers. Other systems sense when the system is powering up and provide alternate signals for a period of time before the audio is reconnected to the driving circuitry. Current solutions like these are complicated, cause an interruption in the audio signal channel, and may provide delays to startup.

Thus, there is a need for improved class D audio amplifiers. The present invention solves these and other problems by providing circuits and methods for reducing pop noise in class D amplifiers.

SUMMARY

Embodiments of the present invention improve class D audio amplifiers. In one embodiment the present invention includes a method for starting up a class D amplifier. The method comprises increasing, gating, and driving. The increasing includes increasing a duty cycle of a pulse train from a first duty cycle to a second duty cycle. The gating includes gating a signal based on the increasing of the duty cycle. The gating results in a gated signal. The driving includes driving an output signal from the gated signal to charge an output capacitor. The output capacitor is coupled to a speaker. The increasing of the duty cycle contributes to the charging of the output capacitor such that switching sounds detectable by the human ear are reduced.

In one embodiment, the switching sounds correspond to 5 mW or more of power transferring to said speaker as a result of said driving of said output signal.

In another embodiment, the second duty cycle is less than or equal to 50%.

In one embodiment the method further comprises filtering the output signal to provide a filtered signal to the speaker. The filtering has a frequency and utilizes the capacitor. The increasing of the duty cycle occurs over a period corresponding to the frequency of the filtering such that the filtered signal is diminished such that the switching sounds produced by the speaker are reduced.

In another embodiment, the signal is a pulse width modulated signal corresponding to an audio signal.

In one embodiment, the method further comprises receiving a continuous signal and converting the continuous signal into a pulse width modulated signal. The signal corresponds to the pulse width modulated signal.

In one embodiment, the present invention includes a circuit. The circuit comprises a gate, a pulse generating circuit, and a drive circuit. The gate circuit is coupled to receive a signal and generate a gated signal. The pulse generating circuit is coupled to provide a control signal to the gate circuit. The drive circuit is coupled to receive the gated signal and is coupled to provide an output signal. The output signal charges an output capacitor. The output capacitor is coupled to a speaker. The control signal includes a pulse train with a duty cycle which increases from a first duty cycle to a second duty cycle. The control signal contributes to the charging of the output capacitor such that switching sounds detectable by the human ear are reduced. The switching sounds do not correspond to the signal.

In another embodiment, the circuit is integrated circuit.

In one embodiment, the gate circuit includes an AND gate. A first terminal of the AND gate is coupled to receive the signal, a second terminal of the AND gate is coupled to receive the control signal, and an output terminal of the AND gate is coupled to provide the gated signal.

In another embodiment, the pulse generating circuit includes a comparator. A first terminal of the comparator is coupled to receive a saw tooth signal. A second terminal of the comparator is coupled to receive a ramping signal. The ramping signal is compared to the saw tooth signal such that an output terminal of the comparator generates the pulse train with the duty cycle which increases.

In one embodiment, the first duty cycle is less than 1%.

In another embodiment, the second duty cycle is less than 50%.

In one embodiment, the circuit further comprises a filter. The filter is coupled to receive the output signal and is coupled to provide a filtered signal to the speaker. The filter has a frequency and utilizes the capacitor. The increasing of the duty cycle occurs over a period corresponding to the frequency of the filter such that the filtered signal is diminished such that the switching sounds produced by the speaker are reduced.

In another embodiment, the signal is a pulse width modulated signal corresponding to an audio signal.

In another embodiment, the circuit further comprises a pulse width modulator circuit. The pulse width modulator circuit is coupled to receive a continuous signal and is coupled to provide a pulse width modulated signal. The signal corresponds to the pulse width modulated signal.

In one embodiment, the present invention includes a class D amplifier circuit. The class D amplifier circuit comprises a first and second modulator, an AND gate, and a driver circuit. The first modulator is coupled to receive a continuous signal. The second modulator coupled to receive a startup signal. The AND gate has a first terminal coupled to receive a first modulated signal from the first modulator and a second terminal coupled to receive a second modulated signal from the second modulator. The driver circuit coupled to receive a gated signal from an output terminal of the AND gate and coupled to provide an output signal to drive a filter coupled in series with a speaker. The second modulator signal includes a pulse train having an increasing duty cycle corresponding to the output signal providing increasing levels of charging to the filter such that switching sounds generated from the speaker and detectable by the human ear are reduced. The switching sounds do not correspond to the continuous signal.

In one embodiment, class D amplifier circuit is an integrated circuit.

In another embodiment, the switching sounds correspond to the drive circuit transferring 5 mW or more of power to the speaker.

In another embodiment, the increasing duty cycle increases from a first duty cycle to a second duty cycle over a period of time. The period of time contributes to reducing the switching sounds.

In another embodiment, the first duty cycle corresponds to an initial charge on the filter. The first duty cycle contributes to an output signal that transfers a charge commensurate with the initial charge such that switching sounds are reduced.

In another embodiment, the second duty cycle corresponds to a target charge on the filter. The second duty cycle contributes to an output signal that transfers a charge commensurate with the target charge such that switching sounds are reduced.

The following detailed description and accompanying drawings provide a better understanding of the nature and advantages of the present invention.

DETAILED DESCRIPTION

Described herein are techniques for circuits and methods for reducing pop noise in class D amplifiers. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 2:
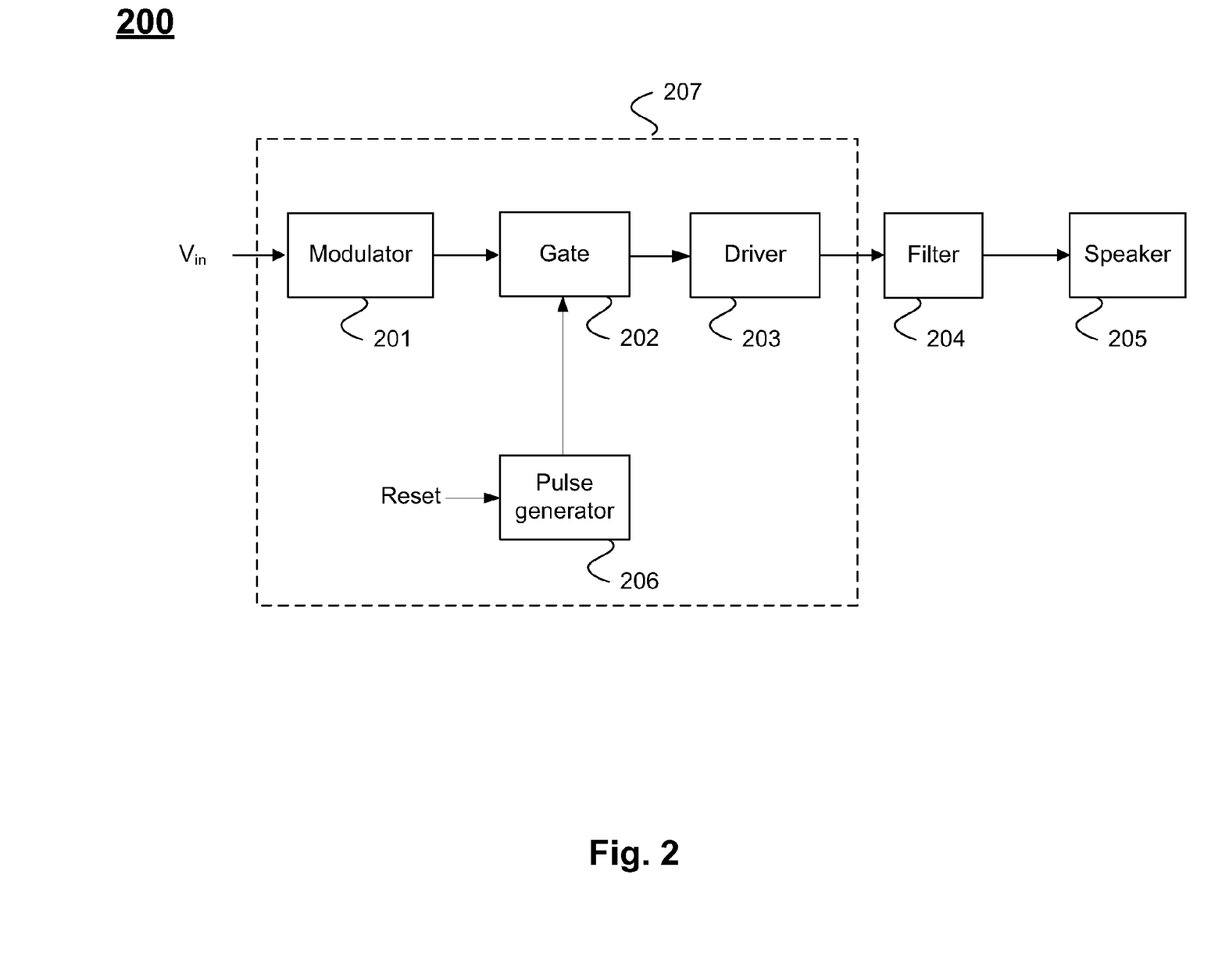
FIG. 2 illustrates a class D amplifier system according to one embodiment of the present invention.

FIG. 2 illustrates a class D amplifier system 200 according to one embodiment of the present invention. Class D amplifier system 200 includes class D amplifier 207, filter 204, and speaker 205. Class D amplifier includes modulator 201, gate circuit 202, driver circuit 203, and pulse generator circuit 206. Class D amplifier system 200 amplifies a continuous signal ($V_{in}$) and produces a sound from speaker 205 such that switching sounds detectable by the human ear are reduced. A typical person may detect switching sounds from an earphone (placed directly outside the ear canal) at powers equal to or greater than 5 mW. A typical person may detect switching sounds from a source 10 cm from the ear at powers equal to or greater than 10 mW. These switching sounds may include but are not limited to popping and clicking noises. These switching sounds do not correspond to the continuous signal.

Modulator 201 receives the continuous signal $V_{in}$ and provides a modulated signal to gate circuit 202. The continuous signal may be a signal corresponding to silence. The continuous signal may be a signal corresponding to music or other sounds. The modulator 201 may produce a pulse width modulated (PWM) signal corresponding to continuous signal $V_{in}$. Modulator 201 provides a modulated signal to gate circuit 202.

Pulse generator circuit 206 provides a control signal to an input of gate 202. Pulse generator circuit 206 may be provided a reset signal upon startup, power down, or any other change of state which may influence the operation of the class D amplifier system 200. Upon receiving a reset signal, pulse generator circuit 206 begins generating a pulse train (i.e. the control signal) with an initial duty cycle. The duty cycle is increased over a period to a final duty cycle. The initial duty cycle may be 0.1%, for example, and the final duty cycle may be approximately 50%. The duty cycle may be increased in steps. The duty cycle may be increased linearly or according to a startup signal, or both. For example, the duty cycle may increase from 0.1% to 50% in linear steps, but after 50% the duty cycle may increase according to an exponential to 100% and remain there until another reset signal is provided to the pulse generator circuit 206.

Gate circuit 202 receives the control signal from pulse generator circuit 206 and gates the modulated signal received from modulator 201. When the control signal is at a high voltage, the gate may allow the pulse width modulated signal to pass to driver circuit 203. The gated signal produced by gate circuit 202 has a maximum duty cycle set by the control signal. For example, the continuous input may correspond to silence and may be providing a DC voltage. In this case, modulator 201 may produce a pulse train with approximately 50% duty cycle. However, the control signal is gating the modulated signal. If the control signal has a 1% duty cycle, then the gated signal can not have more than a 1% duty cycle. As the pulse generator 206 increases the duty cycle of the control signal, the duty cycle of the gated signal correspondingly increases.

Driver 203 receives the gated signal and provides an increasing charge for filter circuit 204 corresponding to the gated signal. The increasing charge for filter circuit 204 allows storage elements to be charged and reduces the energy passing through to speaker 205. As the duty cycle of the control signal increases, the upper limit on the duty cycle of the output signal of driver 203 also increases. Increasing of the duty cycle of the control signal occurs in steps corresponding to a power transferred to speaker 205.

Driver 203 may have a greater voltage rails than the modulator circuit 201, gate circuit 202, or pulse generator circuit 206. Driver 203 may be designed to switch between 0V and 5V, for example. In this example, the modulation circuits (i.e. modulator 201, gate circuit 202, and pulse generator circuit 206) may be supplied at a lower voltage such as a 2.0V supply or utilize a 5V supply as well. In other embodiments, the output driver may utilize 24V supply while the modulation circuits may utilize a 5V supply.

Driver 203 may be comprised of a PMOS and NMOS complimentary output stage with corresponding high side and low side drivers, for example. Driver 203 may also include circuitry for preventing feed through caused by the simultaneous switching of the complimentary output stage. The output stage of driver 203 may include short circuit protection.

Figure 3:
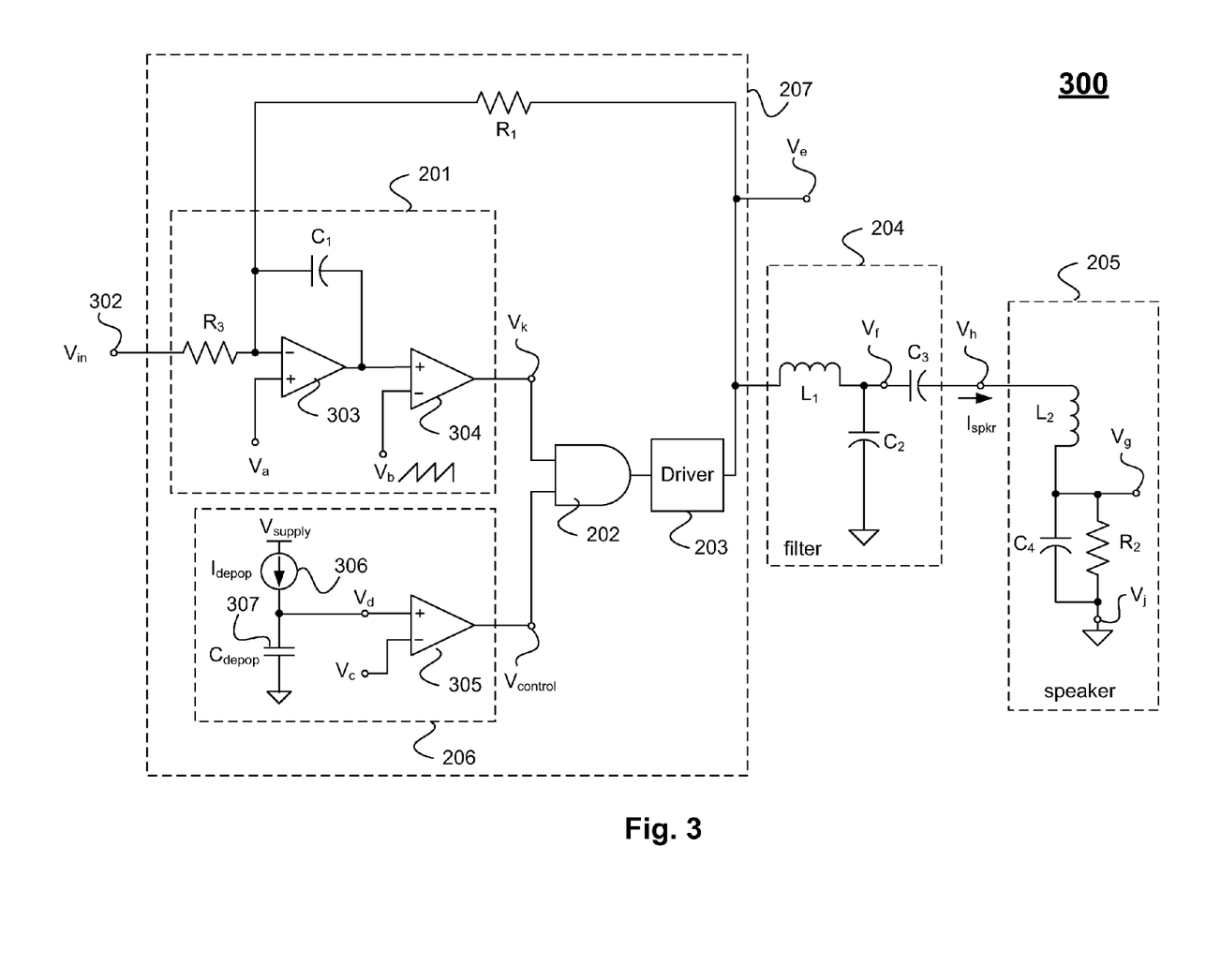
FIG. 3 illustrates a class D amplifier system according to another embodiment of the present invention.

FIG. 3 illustrates a class D amplifier system 300 according to another embodiment of the present invention. Class D amplifier system 300 is similar to class D amplifier system 200. Class D amplifier system 300 includes class D amplifier 207, filter 204, and speaker 205. Class D amplifier 207 includes modulator 201, pulse generator circuit 206, gate circuit 202, driver circuit 203, and resistor R1. In this embodiment, gate circuit 202 is an AND gate. One input terminal of the AND gate is coupled to receive a PWM signal $V_k$ from modulator circuit 201 and another input terminal of the AND gate is coupled to receive a control signal $V_{control}$ from pulse generator circuit 206. The output terminal of the AND gate is coupled to provide a gate signal to driver circuit 203. Driver circuit 203 provides an output signal $V_e$ for class D amplifier 207.

Modulator circuit 201 generates a pulse width modulated signal $V_k$. Resistor $R_1$ provides feedback of the output signal $V_e$ to an inverting terminal of amplifier 303. This feedback cancels out noise elements. Amplifier 303 has a non-inverting terminal coupled to receive a reference voltage $V_a$ and has a resistor $R_3$ coupling the inverting terminal to input terminal 302. Capacitor $C_1$ couples the output terminal to the inverting terminal of amplifier 303.

Amplifier 303 operates as an integrator. An input signal $V_{in}$ is integrated and comparator 304 receives the integrated signal and compares this to a reference saw tooth waveform $V_b$. The non-inverting terminal of comparator 304 is coupled to receive this reference saw tooth waveform $V_b$. The output terminal of comparator 304 is coupled to provide a PWM signal $V_k$ to AND gate 301.

Pulse generating circuit 206 comprises comparator 305 having an inverting terminal coupled to receive a saw tooth waveform $V_c$ and a non-inverting terminal coupled to receive a startup signal $V_d$. Startup signal $V_d$ may be a slow rising ramp generated by a current source 306 having a value $I_{depop}$ coupled to charge a capacitor 307 having a value $C_{depop}$. The time period of charging $T_{depop}$ may be calculated as follows.

$$T_{depop} = \frac{C_{depop} * 2.5}{I_{depop}}$$

The 2.5 term represents an example of half of supply $V_{supply}$ for a 5V supply system. The time period of charging $T_{depop}$ may take into account the characteristics of speaker 205 and/or filter 204.

or may have a more complicated characteristic. For example, the characteristic may have a first ramp at the beginning and then after some initial period have an exponential increase or a step to a predetermined voltage corresponding to a high output at the output terminal of comparator 305. Startup signal $V_d$ creates a control signal $V_{control}$ (i.e. pulse train) having an increasing duty cycle at the second input terminal of AND gate 202.

The PWM modulated signal $V_k$ is gated by the control signal $V_{control}$. AND gate 202 serves as the gate of the PWM signal in this embodiment. The control signal $V_{control}$ limits the pulse duration at the output terminal of AND gate 202 and therefore for the driver signal Ve.

Filter 204 circuit includes inductor $L_1$, capacitor $C_2$, and capacitor $C_3$. Driver circuit 203 produces output voltage $V_e$ which will charge capacitor $C_3$. Inductor $L_1$ and capacitor $C_3$ form a low pass portion of filter circuit 204 which will filter the high frequency switching from the output signal. The remaining portion of the signal will pass through DC blocking capacitor $C_3$ to speaker 205.

Speaker 205 is modeled as an inductor $L_2$ coupled in series with a resistor $R_2$. Capacitor $C_4$ is coupled in parallel with resistor $R_4$. In this embodiment, $V_h$ and $V_j$ remain at substantially the same potential. The power transferred from filter 204 to speaker 205 does not exceed a threshold. If speaker 205 is an earphone, the threshold may be 5 mW, for example. The threshold may reduce any switching sounds detectable by the human ear.

Figure 4A:
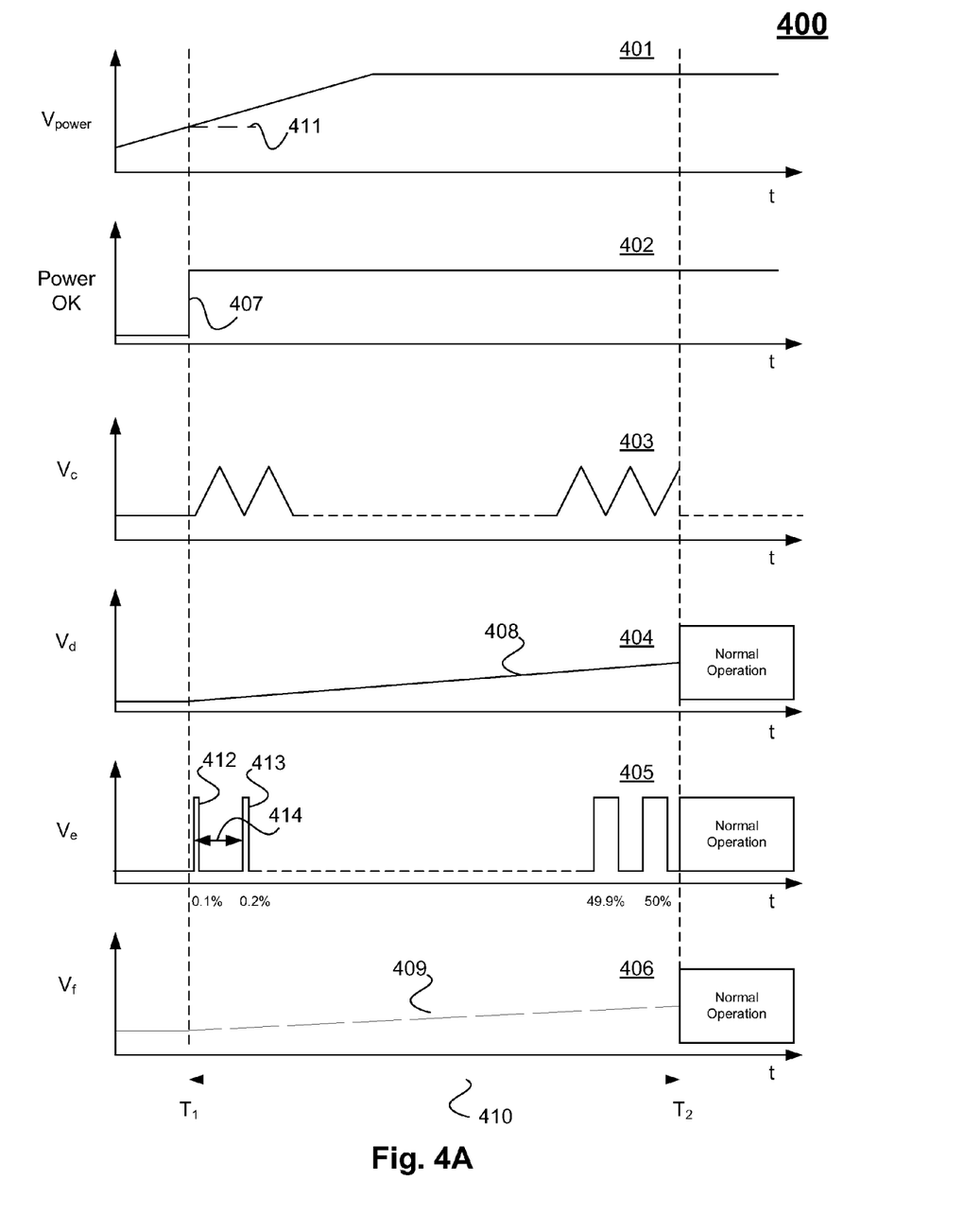
FIG. 4A illustrates a set of graphs associated to the embodiment of FIG. 3.

FIG. 4A illustrates a set of graphs 400 associated to the embodiment of FIG. 3. The set of graphs 400 include graph 401-406. Graph 401 shows a $V_{power}$ signal waveform providing power to the class D amplifier 207 of FIG. 3. Graph 402 shows a power OK signal waveform indicating that $V_{power}$ has passed a predetermined threshold 411 of the $V_{power}$ signal waveform. The power OK signal begins at time $T_1$ and begins a period of transition 410 to time $T_2$. This transition time 410 is a startup time in this embodiment. This time period may be similar to $T_{depop}$ of FIG. 3 described above. Saw tooth waveform Vc, and startup signal waveform $V_d$ may begin at (or after) time $T_1$. Graph 403 shows the saw tooth waveform and graph 404 shows the startup signal ramping up 408. This provides for a ramping of the duty cycle for the output signal $V_e$ shown in graph 405.

Output signal waveform $V_e$ shows a duty cycle of a pulse train beginning at a low duty cycle of 0.1% and ramping to 50% during the period of transition 410. Note the waveforms of graphs 401-406 are exaggerated for purposes of clarity in lieu of exactitude. The dashed lines shown in graph 403 and 405 indicate a continuation of the waveforms as indicated. For example, the saw tooth waveform is exaggerated and the same pattern continues for the length of the transition period 410. Also the dashed lines in graph 405 indicate the continued increasing of the duty cycle for the length of the transition period 410.

During the transition period 410, the voltage $V_f$ of filter 204 of FIG. 3 is ramping 409. Capacitor $C_2$ and $C_3$ are charging such that a diminished signal $V_g$ does not have sufficient energy to generate switching sounds from speaker 205 of FIG. 3. The voltage at $V_g$ is approximately 0V for the duration of the transition period 410.

Pulse 412 transfers less than a threshold of power to the speaker within a period 414. This threshold of power may be 5 mW or 10 mW, for example. During the period 414, the power corresponding to pulse 412 must be dissipated such that the power corresponding to pulse 413 does not provide a cumulative effect which would exceed the threshold of power transferred to the speaker. The control of the percent increase of the duty cycle from pulse 412 to pulse 413 and the frequency of this increase (i.e. related to period 414) may reduce the switching sounds produced by the speaker that may be detectable by a typical human ear.

The current $I_{spkr}$ may be determined such that the amount of power transferred to speaker 205 remains below a threshold. The power dissipated into speaker 205 may be expressed as follows.

$$P_{spkr} = I_{spkr}^2 * R_2$$

For example, if $R_2=8$ ohms and $P_{spkr}=8$ mW, then $P_{spkr}$ is about 31.6 mA. 8 mW may be set as a threshold in one embodiment. Blocking capacitor $C_3$, the width of the pulse, and the voltage deviation all contribute to the speaker current and therefore the power transferred to the speaker.

After time $T_2$ the class D amplifier system enters normal operation. At this time the audio signal may be translated in its entirety as the output signal $V_e$.

Figure 4B:
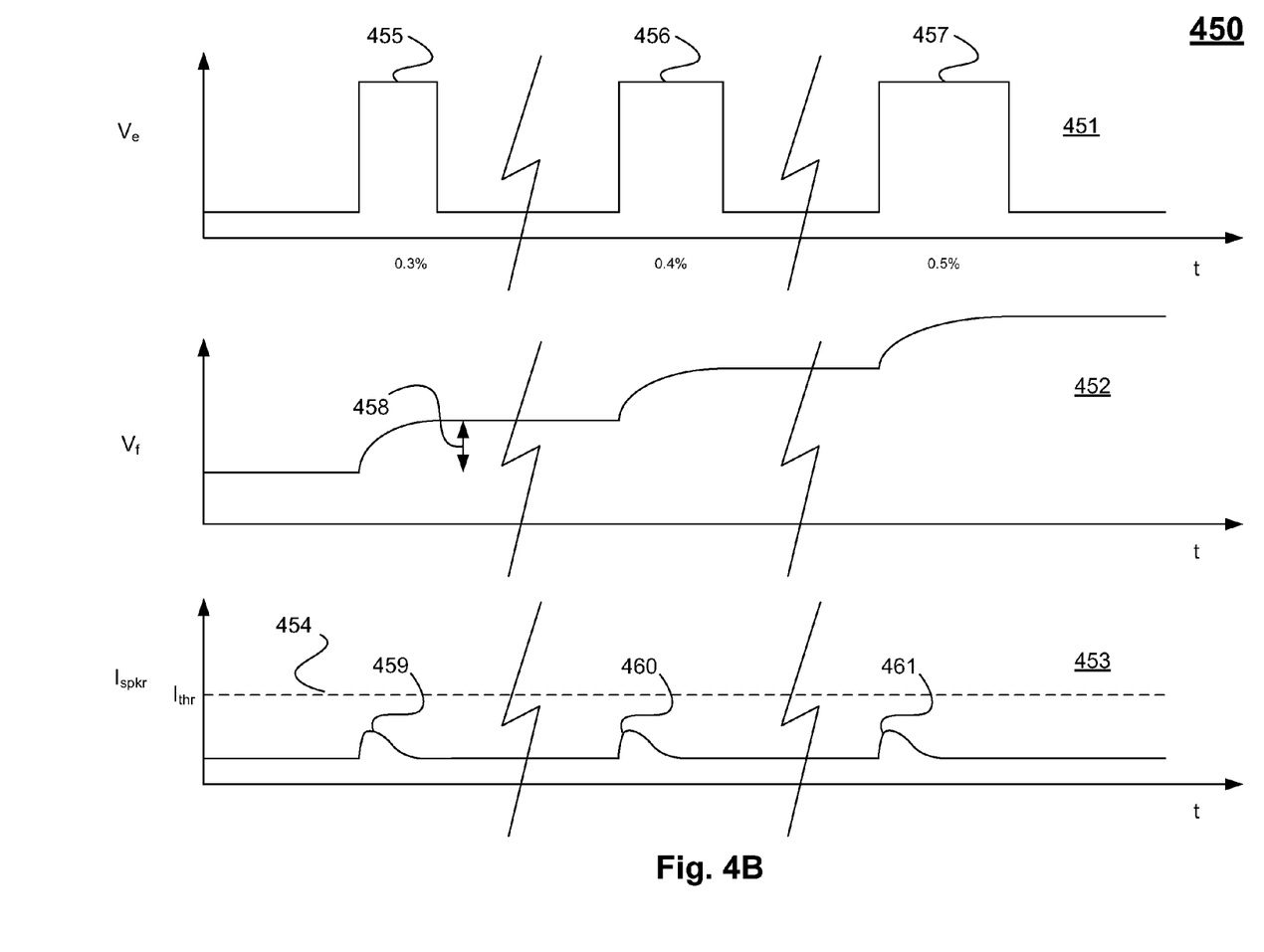
FIG. 4B illustrates a set of graphs which show in more detail the signals associated with the embodiment of FIG. 3.

FIG. 4B illustrates a set of graphs 450 which show in more detail the signals associated with the embodiment of FIG. 3. The set of graphs 450 include graphs 451-453. Each graph shows signals in three sections of time corresponding to the switching of the class D amplifier circuit 300 shown in FIG. 3. Graph 451 shows waveform $V_e$ over three sections of time. Each section shows three successive pulses 455-457. Pulse 455 corresponds to a 0.3% duty cycle. Pulse 456 corresponds to a 0.4% duty cycle. And pulse 457 corresponds to a 0.5% duty cycle.

Graph 452 shows waveform $V_f$ over three sections of time. Waveform $V_f$ increases by delta voltage 458 for each successive increase in duty cycle of waveform $V_e$. The successive increases of duty cycle create a ramping voltage with discrete steps that slowly charges capacitor C3 of FIG. 3.

Graph 453 shows waveform $I_{spkr}$ over three sections of time. Waveform $I_{spkr}$ shows a perturbation for each section of the waveform. The perturbations 459-461 are caused by the successive increases of waveform $V_f$. A threshold $I_{thr}$ corresponds to a power threshold. For example, if a switching amplifier is coupled to an 8 ohm speaker and the power threshold is 5 mW, then following equation is solved.

$$P_{spkr} = I_{spkr}^2 * R_2$$

$$5 \text{ mW} = I_{spkr}^2 * 8 \text{ ohms}$$

$$I_{spkr} = 25 \text{ mA}$$

The current threshold of 25 mA corresponds to the power threshold of 5 mW. Dotted line 454 shows the threshold $I_{thr}$. None of the three perturbations 459-461 exceed the $I_{thr}$, and therefore, the power transferred to the speaker (e.g. speaker 205 of FIG. 3) will be less than 5 mW. The time between perturbations insures that the perturbations do not become cumulative and surpass the threshold of power. The speaker dissipates the power transferred by one pulse to the speaker prior to additional power being transferred by the next pulse.

Figure 5:
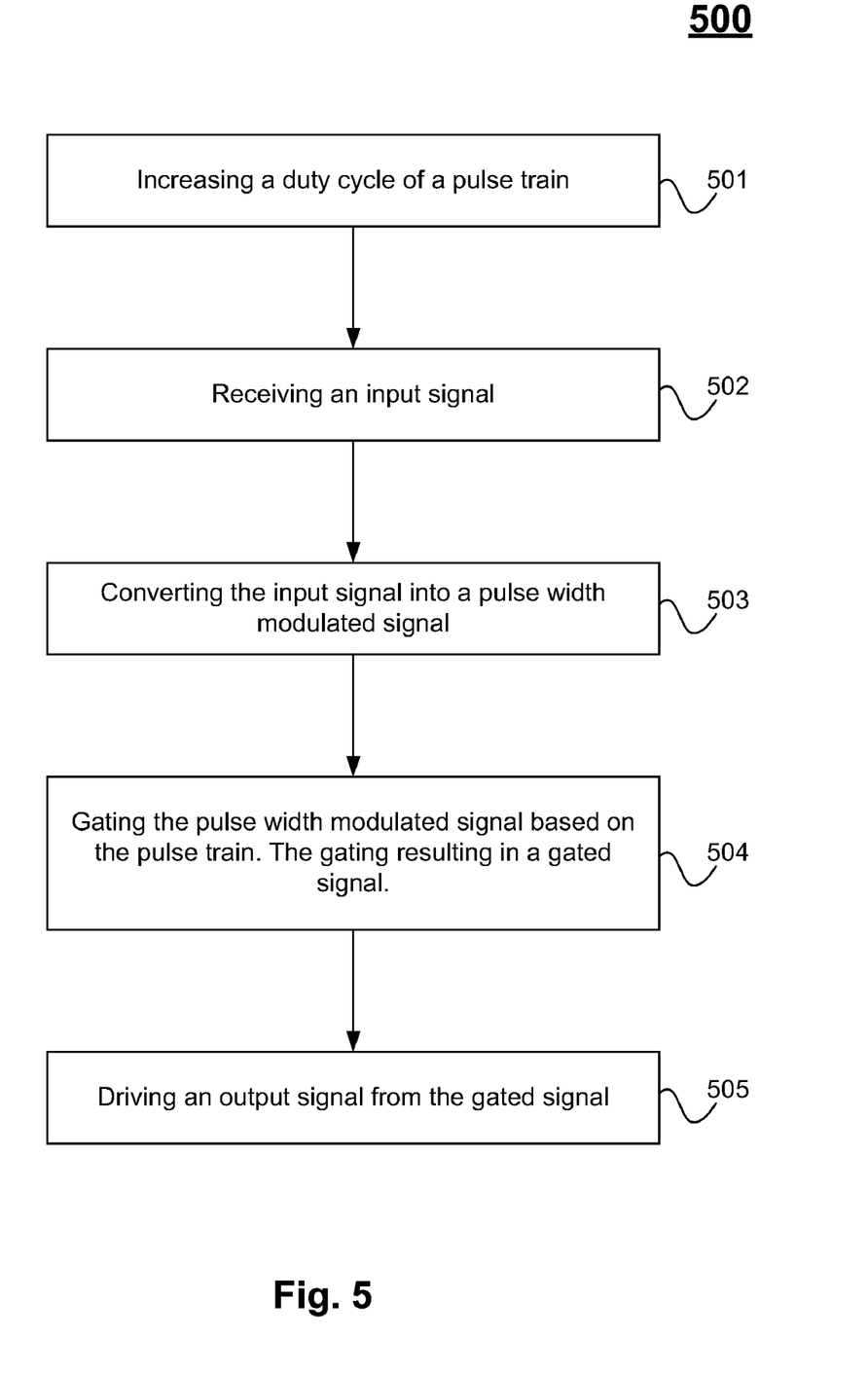
FIG. 5 illustrates a method of starting up a class D amplifier according to one embodiment of the present invention.

FIG. 5 illustrates a method of starting up a class D amplifier according to one embodiment of the present invention. The starting up of the class D amplifier reduces the amount of switching noise (e.g. pop noise) detectable by the human ear.

At 501, the duty cycle of a pulse train is increased. The increasing of the duty cycle may occur for a transition period. The transition period may be a startup of a class D amplifier. The transition period may initiate at a first duty cycle and terminate at a second duty cycle. The first duty cycle may correspond to an output voltage pulse which transfers less than a threshold of power to a speaker. The next duty cycle may correspond to a second pulse which transfers less than the threshold of power to the speaker.

At 502, an input signal is received. This signal corresponds to an audio signal. The signal may be produced by converting a digital signal to an analog signal.

At 503, the input signal is converted to a pulse width modulated signal.

At 504, the pulse width modulated signal is gated based on the pulse train of 501. This results in a gated signal.

At 505, the gated signal is used to drive an output signal to a filter and speaker coupled in series. The gated signal charges a DC blocking capacitor of the filter such that no appreciable signal exists at the speaker to create switching sounds.

Figure 6:
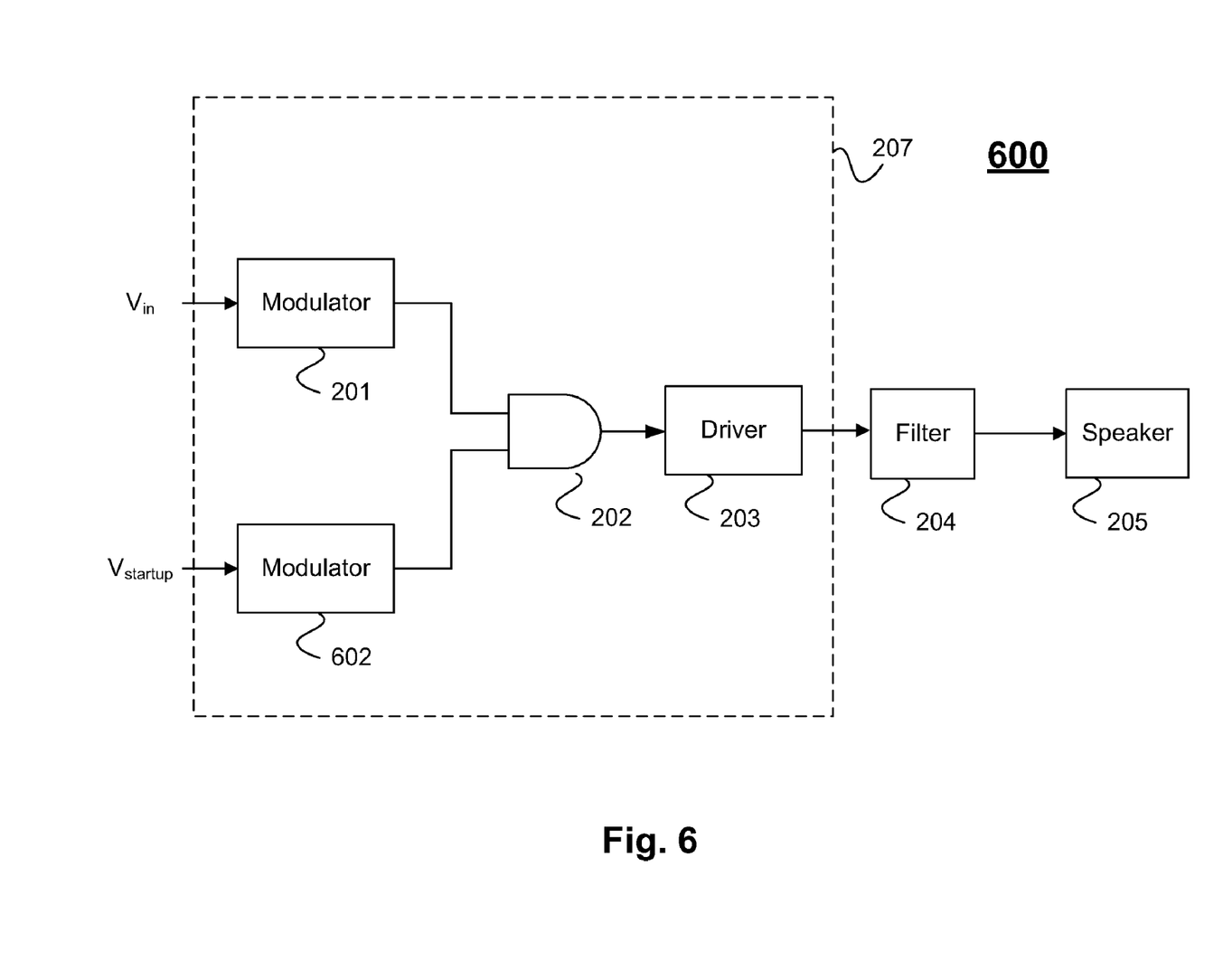
FIG. 6 illustrates a class D amplifier system according to another embodiment of the present invention.

FIG. 6 illustrates a class D amplifier system 600 according to another embodiment of the present invention. Class D amplifier system 600 is similar to class D amplifier system 200 of FIG. 2. Class D amplifier 207 includes modulator 201 and modulator 602.

Modulator 602 receives a startup signal or transition signal. Modulator 602 provides a signal to limit the power transferred during transition periods such as startup, power down, etc. The startup signal may be a simple ramp as in previous embodiments of this application or may be programmable.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A method for starting up a class D amplifier, said method comprising:
   increasing a duty cycle of a pulse train from a first duty cycle to a second duty cycle;
   gating a signal based on said increasing of said duty cycle using a single AND gate, said gating resulting in a gated signal; and
   driving an output signal from said gated signal to charge an output capacitor, said output capacitor coupled to a speaker,
   wherein said increasing of said duty cycle contributes to the charging of said output capacitor such that switching sounds detectable by the human ear are reduced.

2. The method of claim 1 wherein said switching sounds correspond to 5 mW or more of power transferring to said speaker as a result of said driving of said output signal.

3. The method of claim 1 wherein the second duty cycle is less than or equal to 50%.

4. The method of claim 1 further comprising filtering said output signal to provide a filtered signal to said speaker, said filtering having a frequency and utilizing said capacitor,
wherein said increasing of said duty cycle occurs over a period corresponding to said frequency of said filtering such that said filtered signal is diminished such that said switching sounds produced by said speaker are reduced.

5. The method of claim 1 wherein said signal is a pulse width modulated signal corresponding to an audio signal.

6. The method of claim 1 further comprising:
receiving a continuous signal; and
converting said continuous signal into a pulse width modulated signal,
wherein said signal corresponds to said pulse width modulated signal.

7. A circuit comprising:
a gate circuit having a single AND gate only and coupled to receive a signal and generate a gated signal;
a pulse generating circuit coupled to provide a control signal to said gate circuit; and
a drive circuit coupled to receive said gated signal and coupled to provide an output signal,
wherein said output signal charges an output capacitor, said output capacitor coupled to a speaker,
wherein said control signal includes a pulse train with a duty cycle which increases from a first duty cycle to a second duty cycle,
wherein said control signal contributes to the charging of said output capacitor such that switching sounds detectable by the human ear are reduced, said switching sounds not corresponding to said signal, wherein said gate circuit includes a single AND gate only, and
wherein a first terminal of said single AND gate is coupled to receive said signal, a second terminal of said single AND gate is coupled to receive said control signal, and an output terminal of said single AND gate is coupled to provide said gated signal.

8. The circuit of claim 7 wherein said switching sounds correspond to said drive circuit transferring 5 mW or more of power to said speaker.

9. The circuit of claim 7 wherein said pulse generating circuit includes a comparator,
wherein a first terminal of said comparator is coupled to receive a saw tooth signal, a second terminal of said comparator is coupled to receive a ramping signal,
wherein said ramping signal is compared to said saw tooth signal such that an output terminal of said comparator generates said pulse train with said duty cycle which increases.

10. The circuit of claim 7 wherein the first duty cycle is less than 1%.

11. The circuit of claim 7 wherein the second duty cycle is less than or equal to 50%.

12. The circuit of claim 7 further comprising a filter coupled to receive said output signal and coupled to provide a filtered signal to said speaker, said filter having a frequency and utilizing said capacitor,
wherein said increasing of said duty cycle occurs over a period corresponding to said frequency of said filter such that said filtered signal is diminished such that said switching sounds produced by said speaker are reduced.

13. The circuit of claim 7 wherein said signal is a pulse width modulated signal corresponding to an audio signal.

14. The circuit of claim 7 further comprising:
a pulse width modulator circuit coupled to receive a continuous signal and coupled to provide a pulse width modulated signal,
wherein said signal corresponds to said pulse width modulated signal.

15. A class D amplifier circuit comprising:
a first modulator coupled to receive a continuous signal;
a second modulator coupled to receive a startup signal;
a single AND gate having a first terminal coupled to receive a first modulated signal from said first modulator and a second terminal coupled to receive a second modulated signal from said second modulator; and
a driver circuit coupled to receive a gated signal from an output terminal of said single AND gate and coupled to provide a single output signal to drive a filter coupled in series with a speaker,
wherein said second modulated signal includes a pulse train having an increasing duty cycle corresponding to said output signal providing increasing levels of charging to said filter such that switching sounds generated from said speaker and detectable by the human ear are reduced, said switching sounds not corresponding to said continuous signal.

16. The circuit of claim 15 wherein said class D amplifier circuit is an integrated circuit.

17. The circuit of claim 15 wherein said increasing duty cycle increases from a first duty cycle to a second duty cycle over a period of time,
wherein said period of time contributes to reducing said switching sounds.

18. The circuit of claim 17 wherein said first duty cycle corresponds to an initial charge on said filter, wherein said first duty cycle contributes to an output signal that transfers a charge commensurate with said initial charge such that said switching sounds are reduced.

19. The circuit of claim 17 wherein said second duty cycle corresponds to a target charge on said filter, wherein said second duty cycle contributes to an output signal that transfers a charge commensurate with said target charge such that said switching sounds are reduced.

20. The method of claim 6 further comprising, providing feedback from the output signal to said continuous signal through a resistor.

21. The circuit of claim 15 further comprising a resistor coupled to provide feedback from the output signal to the first modulator.

* * * * *